United States Patent
Namiwaka

(10) Patent No.: US 6,411,639 B1
(45) Date of Patent: Jun. 25, 2002

(54) SEMICONDUCTOR LASER MODULE WITH AN EXTERNAL RESONATOR INCLUDING A BAND-PASS FILTER AND REFLECTIVE ELEMENT

(75) Inventor: Masahiko Namiwaka, Tokyo (JP)

(73) Assignee: NEC Corporation, Tokyo (JP)

( * ) Notice: Subject to any disclaimer, the term of this patent is extended or adjusted under 35 U.S.C. 154(b) by 47 days.

(21) Appl. No.: 09/590,698

(22) Filed: Jun. 9, 2000

(30) Foreign Application Priority Data

Jun. 11, 1999 (JP) ............................................ 11-164669

(51) Int. Cl.$^7$ ................................................ H01S 3/08
(52) U.S. Cl. ........................... 372/92; 372/99; 372/101; 372/102; 372/20; 372/21; 385/33; 385/37
(58) Field of Search .............................. 385/37, 25, 92, 385/93, 94, 49, 88; 372/43, 50, 99, 101, 102

(56) References Cited

U.S. PATENT DOCUMENTS

| | | | | |
|---|---|---|---|---|
| 5,617,435 A | * | 4/1997 | Nagai et al. ................... | 372/22 |
| 6,125,222 A | * | 9/2000 | Anthon ......................... | 385/33 |
| 6,195,198 B1 | * | 2/2001 | Hatori .......................... | 359/332 |
| 6,295,306 B1 | * | 9/2001 | Asami .......................... | 372/20 |

FOREIGN PATENT DOCUMENTS

| | | | | |
|---|---|---|---|---|
| JP | 10254001 A1 | * | 9/1998 | ............. G02F/1/37 |

* cited by examiner

Primary Examiner—Brian Healy
Assistant Examiner—Kevin S Wood
(74) Attorney, Agent, or Firm—McGinn & Gibb, PLLC

(57) ABSTRACT

A semiconductor laser module includes a semiconductor laser element, a lens system for condensing laser light onto an optical fiber, a band-pass filter for transmitting laser light having a predetermined wave length, and an optical fiber. The band-pass filter is held by a mechanism for tilting the band-pass filter at a desired angle relative to the traveling direction of the laser light. A reflecting element for reflecting part of the incident laser light is provided in a wave guide of the optical fiber so that a resonator is formed between the reflecting element and the emitting end face of the semiconductor laser element. The reflecting element utilizes a difference in refractive indices of materials forming the reflecting element to provide reflection. Preferably, control of the tilting mechanism is conducted via a control unit in response to an output from a thermal sensor.

14 Claims, 2 Drawing Sheets

SEMICONDUCTOR LASER MODULE WITH AN EXTERNAL RESONATOR INCLUDING A BAND-PASS FILTER AND REFLECTIVE ELEMENT

FIELD OF THE INVENTION

The present invention relates to a semiconductor laser module and in particular to a semiconductor laser module which is preferable for use for an semiconductor laser module with an external resonator.

BACKGROUND OF THE INVENTION

The structure of a prior art semiconductor laser module with an external resonator will be described with reference to FIGS. 3 and 4. FIGS. 3 and 4 are schematic views explaining prior art semiconductor laser modules with an external resonator.

Prior art technique to oscillate a semiconductor laser element at a wave length in a narrow band range comprises using an external resonator which is formed between a reverse side (HR side) of the semiconductor laser element 1 and a fiber grating 7 by providing an optical fiber 5 with the fiber grating 7 having a diffractive grating in a semiconductor laser element 1 oscillatable wave length range as shown in FIG. 3 or using an external resonator which is formed by feedbacking the light which has transmitted through a band-pass filter 4 which transmits light having a predetermined wave length in a semi conductor laser element 1 oscillating wave length range to the semiconductor laser element 1 by means of a reflecting point 8 which is deposited on the tip end of a pig-tail fiber by an HR coat as shown in FIG. 4.

SUMMARY OF THE DISCLOSURE

However, the above-mentioned prior art has the following problems. The approach using the fiber grating 7 which is shown in FIG. 3 has a problem in that the central wave length of the module is shifted due to changes in the environmental temperatures. The reason resides in that the central wave length at 50° C. is shifted forward the longer wave length side by about 0.75 nm in comparison with that at 0° C. in case where the fiber grating 7 is used under an environmental condition of 0–50° C., since the central wave length of the fiber grating 7 usually has a temperature dependency of about 0.015 nm/° C.

The approach for reflecting the transmitted light on a reflecting point 8 which is provided at the tip end of the pig tail fiber as shown in FIG. 4 requires optical components including collimator lens 9, 10 to take the transmitted light from the reflecting point 8 to an optical fiber 5 which is provided at the tip end thereof. Even if these optical components are adjusted at a high precision, an inevitable loss of about 0.5 dB occurs. As a result, it is difficult to achieve a high output of the module and a high reliability of the element.

The present invention has been achieved in view of the above-mentioned problems. It is a primary object of the present invention to provide a semiconductor laser module which is capable of achieving the stabilization of the central wave length and a low coupling loss.

In order to achieve the above-mentioned object, the present invention provides a novel semiconductor laser module. The semiconductor laser module comprises: a semiconductor laser element emitting laser light, an optical fiber guiding the laser light, an optical system condensing the laser light onto the optical fiber, and a band-pass filter which is held by a holding device disposed between the semiconductor laser and the optical fiber transmitting therethrough only the light having a predetermined wave length. The laser module comprises a reflecting element disposed within a wave guide of the optical fiber for reflecting part of incident laser light so that a resonator is formed between the reflecting element and a laser light emitting end face of the semiconductor laser element.

In the present invention, it is preferable that the holding device for holding the band-pass filter includes a mechanism for tilting the band-pass filter at a desired angle relative to the direction of travelling of the laser light emitted from the semiconductor laser element, and in that the reflecting element which is formed in the waveguide of the optical fiber is formed of either a structure of cores having different refractive indices which are connected to each other or a structure in which part of the core is doped with a material modifying light refractive index (e.g., a material of high refractive index).

In the present invention, it is preferable that the reflecting element is separated from the laser light emitting end face of the semiconductor laser element at a distance which is 50 cm or more.

PREFERRED EMBODIMENTS OF THE INVENTION

Figure 1:
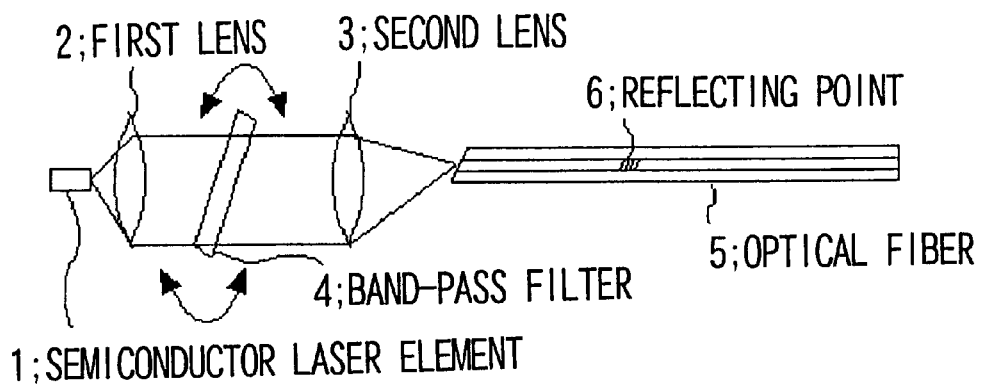
FIG. 1 A view schematically explaining the functions of the semiconductor laser module with an external resonator which is one embodiment of the present invention.

In a preferred mode of embodying the invention, the semiconductor laser module of the present invention at least comprises a semiconductor laser element (reference numeral 1 in FIG. 1), a lens system for condensing laser light onto an optical fiber (reference numerals 2, 3 in FIG. 1), a band-pass filter (reference numeral 4 in FIG. 1) for transmitting laser light having a predetermined wave length and an optical fiber. The band-pass filter is held by means of a holding device having a tilting mechanism for tilting the band-pass filter at a desired angle relative to the travelling direction of the laser light. A reflecting point (6 in FIG. 1) for reflecting part of the incident laser light is provided in a wave guide of the optical fiber so that a resonator is formed between the reflecting point and the emitting end face of the semiconductor laser element. Preferably, control of the tilting mechanism is conducted via a control unit in response to an output from a thermal sensor.

[Embodiments]

In order to describe the above-mentioned mode of embodying the present invention, embodiments of the present invention will now be described with reference to the drawings.

A semiconductor laser module with an external resonator of a first embodiments of the present invention will be described with reference to FIG. 1. FIG. 1 is a view schematically explaining the structure of the semiconductor laser module with an external resonator of the first embodiment.

The structure of the semiconductor laser module with the external resonator of the present embodiment will be described with reference to FIG. 1. The semiconductor laser module with the external resonator of the present embodiment takes out light emitted by a semiconductor laser element 1 from an optical fiber 4 by coupling the semiconductor laser element 1 with the optical fiber 5 at a high efficiency. Reference numerals 1, 2 and 3 in the drawing denote the semiconductor laser element, a first and second lens, respectively. The first lens 2 has a capability of converting the emitted light, which is diverged from the semiconductor laser element 1, into collimated light. The second lens 3 is adapted to focus said collimated light onto an end face of an optical fiber 5 so that the parallel light is incident upon the optical fiber 5 efficiently.

In the present embodiment, a band-pass filter 4 having a characteristic for transmitting only light having a predetermined wavelength among the light from the semiconductor laser element 1 is disposed between the first and second lens 2 and 3. The band-pass filter 4 is held by means of a holding device (not shown) having a tilting mechanism which is capable of tilting the band-pass filter 4 at a desired angle relative to the travelling direction of the laser light, so that the angle of the band-pass filter 4 can be desiredly changed (control led) with respect to the collimated light which is converted by the first lens 2.

The optical fiber 5 has an end face which is obliquely ground so that the light which is reflected on the incident end face is not reversed or returned to the semiconductor laser element 1 and is formed on its surface with an anti-reflecting film. The reference numeral 6 in the drawing denotes a reflecting point on which part of the light which has transmitted through the optical fiber 5 is reflected. The reflecting point 6 makes use of the reflection which takes place in an interface between two materials having different refractive indices. The reflecting point 6 is made of cores having different indices which are connected to each other or a core, part of which is doped with a material having a high refractive index for modifying the refractive index of the fiber.

Although the transmitting wave lengths and the half-value width of the band-pass filter 4 can be preset to a desired wave length and a half value width which are desired to fall within a narrow band of the oscillating wave length band range of the semiconductor laser element, the half-value width is, for example, about 0.1 through 3.0 nm, preferably 1.0 nm or less. The band-pass filter 4 may be fabricated by vacuum depositing an dielectric film of $SiO_2$ on a glass substrate such as quartz substrate such that it will have a transmitting characteristic in the predetermined wave length band range. The band-pass filter 4 is disposed in such a position that it can receive the light which has been emitted from the semiconductor laser element 1 and converts it into collimated light by the first lens 2.

The reflection efficiency of the reflecting point 6 utilizing the difference in the refractive index in the optical fiber 5 is usually 0.5 to 30% depending upon the reflection efficiency of the front side of the semiconductor laser element 1 which is used and preferably 1 to 4%. Preferably, the distance between the reflecting point 6 and the HR side of the semiconductor laser 1 is 50 cm or more.

Now, the operation of the semi conductor laser module of the present embodiment will be described. The spectrum of the diverging light which is emitted from the semiconductor laser element 1 has wave length components in a relatively broad band range. This light is converted into collimated light by means of the first lens 2. When it passes through the band-pass filter 4, only light having the wave length components in a narrow band range can pass therethrough due to its band-pass characteristics and is condensed by the second lens 3.

When the collimated light transmits through the band-pass filter 4, the central wave length of the transmitting light has the dependency on the angle at which the collimated light transmits through the band-pass filter. Generally, the collimated light has a tendency to shift toward the longer wave length side as the angle becomes larger.

Accordingly, the environmental temperature outside and inside of the semiconductor laser module is measured by temperature measuring means such as thermal sensor which is disposed on the semiconductor laser module. The tilting angle for the band-pass filter 4, at which the central wave length of the taken out laser light can be made a desired value, is determined based upon the measured data. The holding device is tilted by using a control unit including a drive mechanism such as a step motor. This adjusts the tilting angle of the band-pass filter 4 for finely adjusting the wave length of the laser light.

The laser light which is condensed by the second lens 3 is focused on the end face of the optical fiber 5. After the laser light propagates through the optical fiber 5, part of the laser light is reflected on the reflecting point 6. The reflected laser light is reversed and is returned to the semiconductor laser element 1 again via the second lens 3, band-pass filter 4 and the first lens 2. A resonator is formed between the reverse face (HR face) of the semiconductor laser element 1 and the reflecting point 6. Laser oscillation can be achieved in a wave length band which is determined by the transmitting characteristics of the band-pass filter 4.

On the other hand, most of the laser light passes through the reflecting point 6 and is taken out in a direction toward the other end of the optical fiber 5. Since a component which is required for the taking out the light, such as collimator lens disposed in a position after the reflecting point 6 in the present embodiment is not necessary, no additional loss takes place so that low coupling loss can be achieved.

Since the band-pass filter 4 is capable of changing the angle relative to the collimated light from the first lens 2 in the configuration of the present embodiment, the deviation of the above-mentioned central wave length can be corrected by changing the angle of the band-pass filter 4 even if the central wave length changes due to changes in the environmental temperature of the module. Accordingly, the central wave length of the light which is taken out from the tip end of the optical fiber can be kept constant independently of the environmental temperature, the module can be stably operated.

[Embodiment 2]

Figure 2:
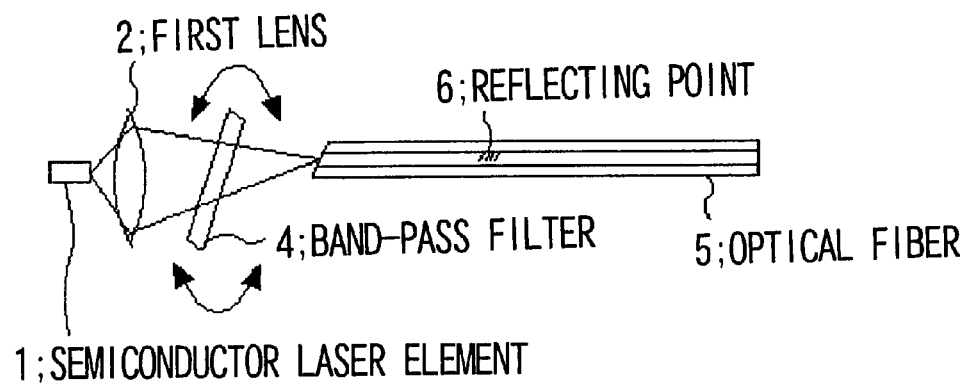
FIG. 2 A view schematically explaining the functions of the semiconductor laser module with an external resonator which is one embodiment of the present invention.
Figure 3:
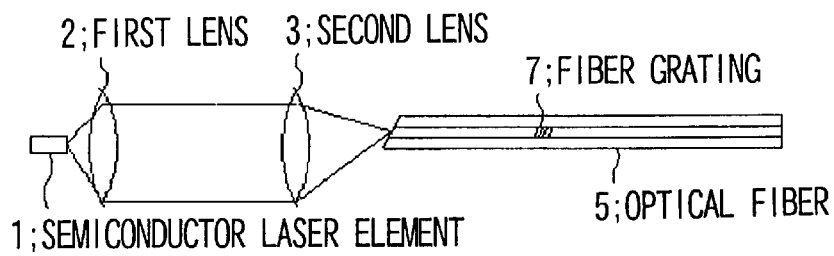
FIG. 3 A view showing the structure of an prior art semiconductor laser module with an external resonator.
Figure 4:
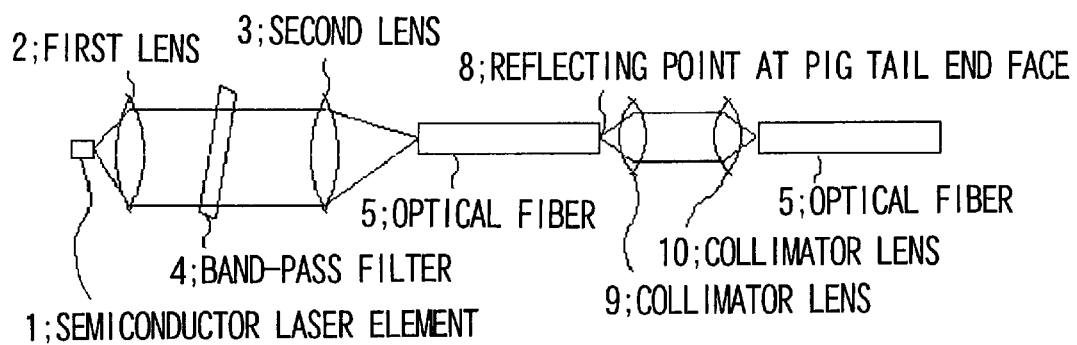
FIG. 4 A view showing the structure of an prior art semiconductor laser module with an external resonator.

Now, a semiconductor laser module with an external resonator which is a second embodiment of the present invention will be described with reference to FIG. 2. FIG. 2 is a view schematically explaining the structure of the semiconductor laser module with an external resonator of the second embodiment. The present embodiment is substantially identical with the above-mentioned first embodiment except that the structure for condensing the light emitted from the semiconductor laser element is altered.

In the semiconductor laser module of the external resonator of the second embodiment, only the first lens 2 for condensing the light emitted from the semiconductor laser element 1 is disposed between the semiconductor laser element 1 and the optical fiber 5 as shown in FIG. 2. A band-pass filter 4 which transmits only the light having a predetermined wave length among the light emitted from the semiconductor laser element 1 is disposed between the first lens 2 and the optical fiber 5.

Similarly to the above-mentioned first embodiment, this band-pass filter 4 is held by means of the holding device (not shown) having a tilting mechanism which is capable of tilting the band-pass filter 4 at a desired angle relative to the travelling direction of the laser light. The optical fiber 5 has an end face which is obliquely ground so that the light which is reflected on the incident end face is not reversed or returned to the semiconductor laser element 1 and is formed on its surface with an anti-reflecting film. The reflecting point 6 makes use of the reflection which takes place in an interface between two materials having different refractive indices.

Although the transmitting wave length and the half-value width of the band-pass filter 4 can be preset to a desired wave length and a half-value width which are desired to fall within a narrow band of the oscillating wave length band range of the semiconductor laser element, the half-value width is, for example, about 0.1 through 3.0 nm, preferably 1.0 nm or less. The reflection factor of the reflecting point 6 utilizing the difference in the refractive index in the optical fiber 5 is usually 0.5 to 30% depending upon the reflection efficiency of the front side of the semiconductor laser element 1 which is used and preferably 1 to 40%. Preferably, the distance between the reflecting point 6 and the HR side of the semiconductor laser 1 is 50 cm or more.

Now, the operation of the semiconductor laser module of the present embodiment will be described. The light which is emitted from the semiconductor laser element 1 and is diverged and condensed on the optical fiber 5 by the first lens 2. Only light having the wave length components in a narrow band range can pass through the band-pass filter 4 before reaching at the optical fiber 5.

The laser light which is condensed by the first lens 2 is focused on the end face of the optical fiber 5. After the laser light propagates through the optical fiber 5, part of the laser light is reflected on the reflecting point 6. The reflected laser light is reversed and is returned to the semiconductor laser element 1 again via the band-pass filter 4 and the first lens 2. A resonator is formed between the reverse face (HR face) of the semiconductor laser element 1 and the reflecting point 6. Laser oscillation can be achieved in a wave length band which is determined by the transmitting characteristics of the band-pass filter 4.

On the other hand, most of the laser light passes through the reflecting point 6 and is taken out in a direction toward the other end of the optical fiber 5. Since a component which is required for the taking out the light, such as collimator lens disposed in a position after the reflecting point 6 in the present embodiment is not necessary similarly to the above-mentioned first embodiment, no additional loss takes place so that low coupling loss can be achieved.

Since the band-pass filter 4 is also capable of changing the angle in the configuration of the present embodiment, the deviation of the above-mentioned central wave length can be corrected by changing the angle of the band-pass filter 4 even if the central wave length changes due to changes in the environmental temperature of the module. Accordingly, the central wave length of the light which is taken out from the tip end of the optical fiber can be kept constant independently of the environmental temperature, the module can be stably operated. The meritorious effects of the present invention are summarized as follows.

As mentioned above, the present invention provides an advantage in that the coupling loss of the semiconductor laser module can be reduced. The reason is that no components such as collimator lens for guiding the light from the reflecting point at the pig tail to the leading optical fiber is required, so that no additional loss at this point takes place. Accordingly, providing high output of the semiconductor laser module and the improvement in the reliability of the element can be achieved.

The present invention also provides an advantage in that the central wave length can be stably kept even if the environmental temperature changes. The reason is that the central wave length in the transmitted wave length band can be changed (controlled) by adjusting the angle of the band-pass filter relative to the travelling direction of the laser light, so that the deviation of the central wave length due to changes in environmental temperature can be corrected.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor laser module, comprising:

a semiconductor laser element emitting laser light;

an optical fiber guiding said laser light;

an optical system condensing said laser light onto said optical fiber; and a band-pass filter which is held by a holding device that is disposed between said semiconductor laser and said optical fiber and transmits therethrough only light having a predetermined wavelength, wherein said laser module comprises a reflecting element that is disposed within a wave guide of said optical fiber, reflects a part of incident laser light so that a resonator is formed between said reflecting element and a laser light emitting end face of said semiconductor laser element, and is formed in said waveguide of said optical fiber by a structure of cores including different refractive indices which are connected to each other.

2. The semiconductor laser module as defined in claim 1, wherein said holding device comprises a tilting mechanism that tilts said band-pass filter at a desired angle relative to a direction of traveling of said laser light emitted from said semiconductor laser element.

3. A semiconductor laser module, comprising:

a semiconductor laser element emitting laser light;

an optical fiber guiding said laser light;

an optical system condensing said laser light onto said optical fiber; and a band-pass filter which is held by a holding device that is disposed between said semiconductor laser and said optical fiber and transmits therethrough only light having a predetermined wavelength, wherein said laser module comprises a reflecting element that is disposed within a wave guide of said optical fiber, reflects a part of incident laser light so that a resonator is formed between said reflecting element and a laser light emitting end face of said semiconductor laser element, and is separated from the laser light emitting end face of said semiconductor laser element at a distance which is 50 cm or more.

4. A semiconductor laser module, comprising:
a semiconductor laser element emitting laser light;
an optical fiber guiding said laser light;
an optical system condensing said laser light onto said optical fiber; and
a band-pass filter which is held by a holding device that is disposed between said semiconductor laser and said optical fiber and transmits therethrough only light having a predetermined wavelength,
wherein said holding device comprises a tilting mechanism that tilts said band-pass filter at a desired angle relative to a direction of traveling of said laser light emitted from said semiconductor laser element, and
wherein said laser module comprises a reflecting element that is disposed within a wave guide of said optical fiber, reflects a part of incident laser light so that a resonator is formed between said reflecting element and a laser light emitting end face of said semiconductor laser element, and is separated from the laser light emitting end face of said semiconductor laser element at a distance which is 50 cm or more.

5. A semiconductor laser module, comprising:
a semiconductor laser element emitting laser light;
an optical fiber guiding said laser light;
an optical system condensing said laser light onto said optical fiber; and
a band-pass filter which is held by a holding device that is disposed between said semiconductor laser and said optical fiber and transmits therethrough only light having a predetermined wavelength,
wherein said laser module comprises a reflecting element that is disposed within a wave guide of said optical fiber, reflects a part of incident laser light so that a resonator is formed between said reflecting element and a laser light emitting end face of said semiconductor laser element, is separated from the laser light emitting end face of said semiconductor laser element at a distance which is 50 cm or more, and is made up of either a structure of cores having different refractive indices which are connected to each other or a structure in which part of the core is doped with a material modifying a light refracting index.

6. A semiconductor laser module, comprising:
a semiconductor laser element emitting laser light;
an optical fiber guiding said laser light;
an optical system condensing said laser light onto said optical fiber; and
a band-pass filter which is held by a holding device that is disposed between said semiconductor laser and said optical fiber and transmits therethrough only light having a predetermined wavelength,
wherein said holding device comprises a tilting mechanism that tilts said band-pass filter at a desired angle relative to a direction of traveling of said laser light emitted from said semiconductor laser element, and
wherein said laser module comprises a reflecting element that is disposed within a wave guide of said optical fiber, reflects a part of incident laser light so that a resonator is formed between said reflecting element and a laser light emitting end face of said semiconductor laser element, is separated from the laser light emitting end face of said semiconductor laser element at a distance which is 50 cm or more, and is made up of either a structure of cores having different refractive indices which are connected to each other or a structure in which part of the core is doped with a material modifying a light refracting index.

7. The semiconductor laser module as defined in claim 1, wherein said reflecting element is disposed separated from the laser light emitting end face of said semiconductor laser element at a distance that generates resonance between said laser light emitting end face and reflecting element.

8. A semiconductor laser module, comprising:
a semiconductor laser element emitting laser light;
an optical fiber guiding said laser light;
an optical system condensing said laser light onto said optical fiber; and
a band-pass filter which is held by a holding device that is disposed between said semiconductor laser and said optical fiber and transmits therethrough only light having a predetermined wavelength,
wherein said laser module comprises a reflecting element that is disposed within a wave guide of said optical fiber and reflects a part of incident laser light so that a resonator is formed between said reflecting element and a laser light emitting end face of said semiconductor laser element,
wherein said holding device comprises a tilting mechanism that tilts said band-pass filter at a desired angle relative to a direction of traveling of said laser light emitted from said semiconductor laser element, and that is controlled by a control unit in response to an output of a thermal sensor disposed on said laser module.

9. A semiconductor laser module, comprising:
a semiconductor laser element emitting laser light;
an optical fiber guiding said laser light;
an optical system condensing said laser light onto said optical fiber; and
a band-pass filter which is held by a holding device that is disposed between said semiconductor laser and said optical fiber and transmits therethrough only light having a predetermined wavelength,
wherein said laser module comprises a reflecting element that is disposed within a wave guide of said optical fiber and reflects a part of incident laser light so that a resonator is formed between said reflecting element and a laser light emitting end face of said semiconductor laser element, and
wherein angles of said holding device are controlled in accordance to the temperature of said laser module.

10. The semiconductor laser module as defined in claim 1, wherein said reflecting element is formed in said waveguide of said optical fiber by a structure in which part of the core is doped with a material modifying a light refractive index.

11. The semiconductor laser module as defined in claim 1, wherein said tilting mechanism is controlled by a control unit in response to an output of a thermal sensor disposed on said laser module.

12. The semiconductor laser module as defined in claim 1, wherein an angle of said holding device is controlled in accordance to a temperature of said laser module.

13. A method of establishing external resonance by a semiconductor laser module, comprising:
emitting laser light from a semiconductor laser element;
transmitting a predetermined wavelength of said laser light through a band-pass filter;

condensing said predetermined wave length of said laser light transmitted through said band-pass filter onto an optical fiber;

reflecting a part of said predetermined wave length of said laser light incident on said optical fiber at a reflecting element disposed within a wave guide of said optical fiber; and separating said reflecting element from a laser light emitting end face of said semiconductor by a distance of 50 cm or more.

14. A method of establishing external resonance by a semiconductor laser module, comprising:

emitting laser light from a semiconductor laser element;

transmitting a predetermined wavelength of said laser light through a band-pass filter;

condensing said predetermined wave length of said laser light transmitted through said band-pass filter onto an optical fiber; and reflecting a part of said laser light incident on said optical fiber at a reflecting element disposed within a wave guide of said optical fiber by utilizing a difference in refractive indices of materials comprising said reflective element.

* * * * *